US005886428A

United States Patent [19]

Feiler et al.

[11] Patent Number: 5,886,428

[45] Date of Patent: Mar. 23, 1999

[54] SWITCH, ESPECIALLY RELAY

[75] Inventors: Jochen Feiler, Heilbronn; Daniel Josef Jendritza, Dillingen/Saar; Hartmut Janocha, Saarbrücken; Horst Binnig, Neckarsulm, all of Germany

[73] Assignee: Bach GmbH & Co., Heilbronn, Germany

[21] Appl. No.: 907,771

[22] Filed: Aug. 8, 1997

[30] Foreign Application Priority Data

Aug. 10, 1996 [DE] Germany ........................ 196 32 347.9

[51] Int. Cl.[6] ........................................ H01L 41/00

[52] U.S. Cl. .......................... 307/119; 310/311; 310/317; 310/330

[58] Field of Search .................................... 307/119, 116; 310/323, 328, 330, 311, 317; 200/181

[56] References Cited

U.S. PATENT DOCUMENTS

| | | | |
|---|---|---|---|
| 3,688,135 | 8/1972 | Koda et al. | 310/330 |
| 3,777,093 | 12/1973 | Sterns et al. | 200/181 |
| 4,425,524 | 1/1984 | Hillman | 200/181 |
| 4,461,968 | 7/1984 | Kolm et al. | 310/330 |
| 4,473,859 | 9/1984 | Stone et al. | 200/181 |
| 4,678,957 | 7/1987 | Harnden et al. | 310/317 |

*Primary Examiner*—Albert W. Paladini
*Attorney, Agent, or Firm*—Robert W. Becker & Associates

[57] ABSTRACT

A switch has at least two switching elements and a drive member for moving at least one of the switching elements relative to the other switching element for opening and closing the switch. The at least one switching element is fixedly connected to the drive member and the drive member is a solid-state energy converter.

23 Claims, 6 Drawing Sheets

SWITCH, ESPECIALLY RELAY

BACKGROUND OF THE INVENTION

The present invention relates to a switch, especially a relay, with at least two switching elements. One of them is movable by a drive member relative to the other switching element for opening and closing the switch.

In known relays, the switching element are contact springs which are connected to one another by a slide. The slide is brought into its initial position by the contact springs whereby in the initial position the slide rest at the drive member which is the armature of a solenoid. When the relay is supplied with current, the armature is moved so that an opener of the relay opens and/or a closing element is closed. As soon as the relay opens, the slide, in general, is returned by the spring bias of the contact spring or by an additional spring into the initial position. The armature itself is biased by a spring force so that when the relay opens it is returned into the initial position. When fusing of the contact pieces connected to the contact springs occurs, the slide remains in its moved position while the armature is returned by the spring force into the initial position. Such a relay is constructively complicated and expensive because a plurality of contact springs and optionally additionally a return spring must be provided. This requires a large constructive size of the relay and results in considerable movable masses and thus increased switching times.

It is therefore an object of the present invention to embody a switch of the aforementioned kind such that it is comprised only of a few components, requires only a minimal constructive size and has minimal switching times.

SUMMARY OF THE INVENTION

The switch of the present invention is primarily characterized by the following features:

at least two switching elements;

a drive member for moving at least one of the switching elements relative to another one of the switching elements for opening and closing the switch:

wherein the at least one switching element is fixedly connected to the drive member and wherein the drive member is a solid-state converter.

The control voltage is supplied to the monitoring unit.

In the inventive switch one of the switching elements is connected fixedly to the drive member which is in the form of a solid-state energy converter. Due to the fixed connection of switching element and drive member, the drive member remains in the displaced or moved position when fusion of the switching element occurs so that, in a simple manner and without additional sensors, this state of the switch can be detected and evaluated. Since the drive member is embodied as a solid-state energy converter, very short switching times are provided. Furthermore, the masses to be moved are very small which is also advantageous with respect to the switching times. Due to the fixed connection of the switching element and drive member, it is, in principle, sufficient to provide two switching elements in order to monitor the proper operation of the switch.

BRIEF DESCRIPTION OF THE DRAWINGS

The object and advantages of the present invention will appear more clearly from the following specification in conjunction with the accompanying drawings in which.

DESCRIPTION OF PREFERRED EMBODIMENTS

Figure 1:
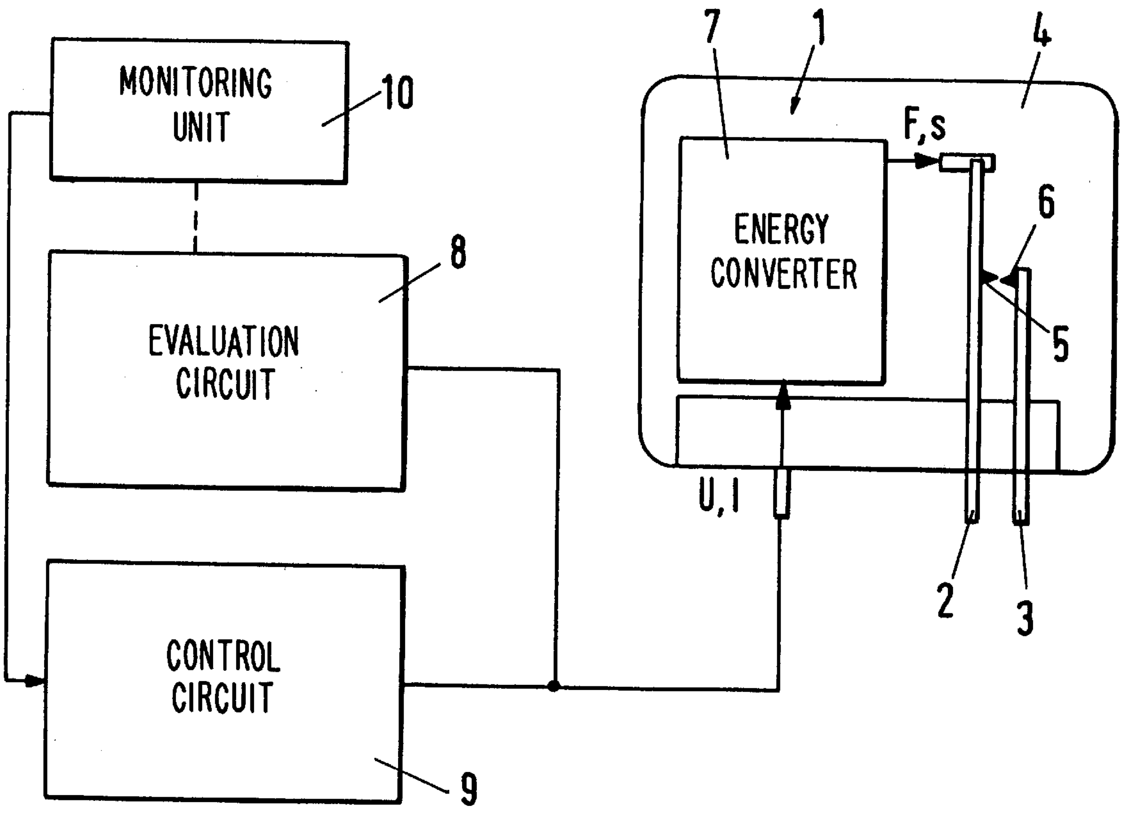
FIG. 1 is a schematic representation of the drive member for the inventive switch.

The present invention will now be described in detail with the aid of several specific embodiments utilizing FIGS. 1 through FIG. 1 shows a switch 1 which in the shown embodiment is a relay. The switch 1 can, for example, be also embodied as a high-speed circuit breaker, a low voltage release, a residual current operated device etc. In the following, the switch 1 in the form of a relay is to be disclosed in detail.

The switch 1 comprises as switching elements two contact springs 2, 3 which are supported within the switch housing 4. The ends of the contact springs 2, 3 extending from the switch housing 4 provide connectors (terminals) via which current can be supplied. The two contact springs 2, 3 may be provided with a contact piece 5, 6 respectively. The longer one of the contact springs 2 is fixedly connected to the energy converter 7. The energy converter 7 is comprised of a ferroelectric piezo ceramic material, for example a foil comprised of lead zirconate titanate or polyvinylidene fluoride, or of a magnetostrictive rare earth metal, for example, Terfenol-D. When the energy converter 7 is moved in a manner to be described in the following, the contact spring 2 is bent resiliently such that its contact piece 5 comes into contact with the contact piece 6 of the contact spring 3. In the schematic representation according to FIG. 1, the force F resulting from bending of the energy converter 7 as well as the corresponding displacement travel s are represented symbolically by an arrow.

Should the contact pieces or points 5, 6 become fused together, the energy converter 7, because of its rigid connection to the contact spring 2, remains in the displaced position. Thus, the electric terminal behavior, especially the electric impedance, will change. The switch 1 is connected to evaluation circuit 8 and a control circuit 9. The evaluation circuit 8 detects the electrical terminal behavior of the energy converter 7 and emits a corresponding signal to monitoring unit 10. When the contact points 5, 6 are not fused to one another, the monitoring unit 10 will receive a corresponding signal. It will then send, in turn, a corresponding signal to the control circuit 9 which can again trigger the switch 1. When the contact points 5, 6 are fused together, this is detected by the evaluation circuit 8 and a respective locking signal is supplied to the monitoring unit 10. The latter, in turn, supplies a corresponding signal to the control circuit 9 so that it will no longer trigger the switch 1.

Figure 2:
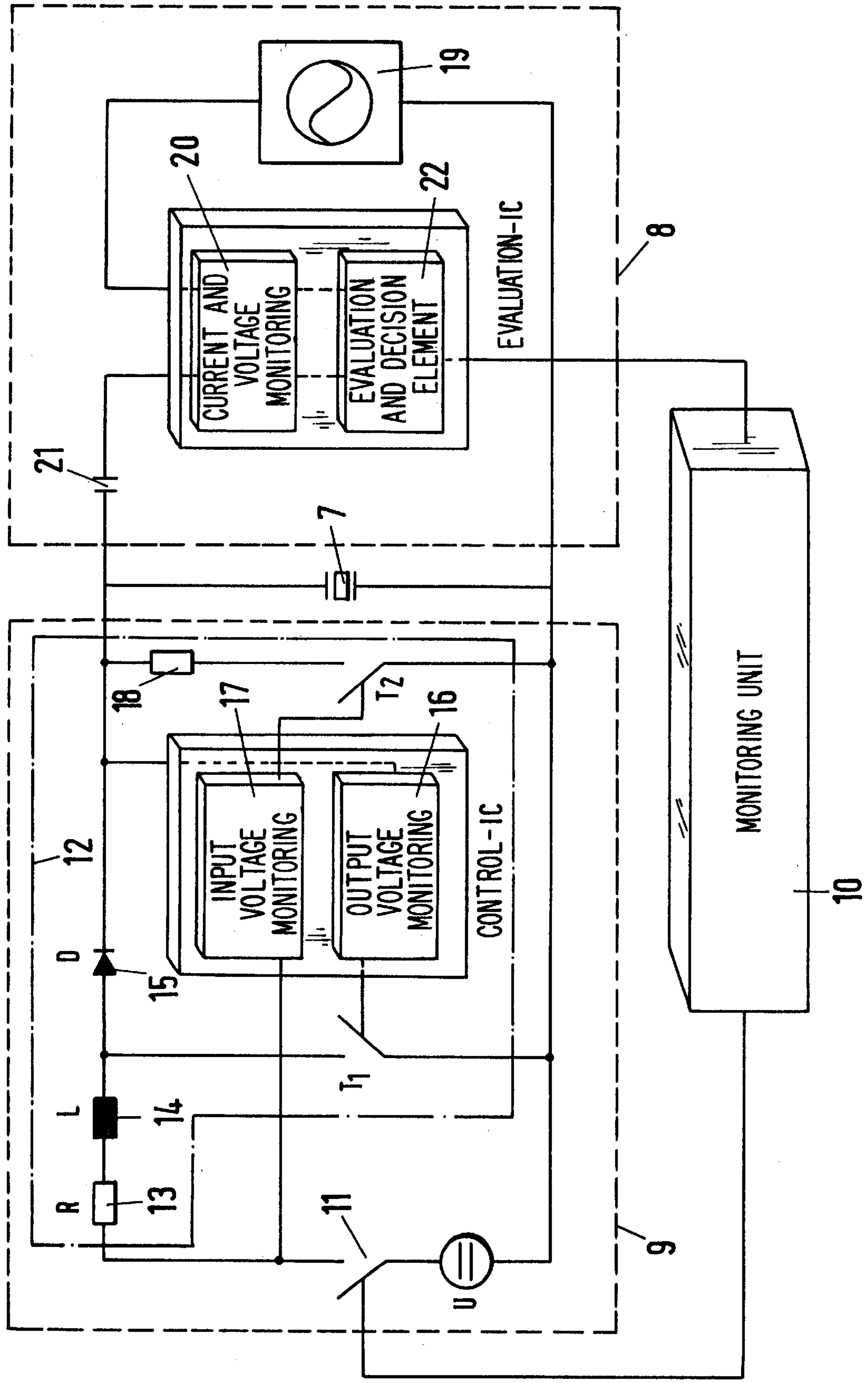
FIG. 2 is a first embodiment of the drive member.

In the embodiment according to FIG. 2, the energy converter 7 is in the form of a piezo element. The monitoring unit 10 supplies a control signal to the switch 11 of the control circuit 9. It is represented by a dashed line. Downstream of the switch 11 a boost converter 12 is provided which is represented by a dash-dotted line. It converts a low voltage, for example, 24 V into high voltage, for example, 400 V required for operating the piezo element 7. The boost converter 12, for example, has a resistor 13, an inductor 14, and a diode 15. These components are serially connected to one another and to the switch 11. The voltage supplied to the piezo element 7 is monitored by the input voltage monitor 16. When voltage for operating the piezo element 17 is too low, a switch $T_1$ is switched by the output voltage monitor 16 with high frequencies, for example, between 20 and 40 kHz until the required voltage is present at the piezo element 7. Then the switch $T_1$ is opened again. When the voltage at the piezo element 7 drops below the preset limit, this is detected by the output voltage monitor device 16, and the switch $T_1$ is again operated in the aforedescribed manner. The switch $T_1$ is connected parallel to the piezo element 7 (and serially connected to the diode 15) and is a component of the boost converter 12, as is the output voltage monitor 16.

When the switch 11 of the control circuit 9 is opened by the monitoring unit 10 with the aid of a corresponding signal, no input voltage is provided. This is detected by an input voltage monitor 17 of the boost converter 12 to which is connected a switch $T_2$. It is switched in parallel to the piezo element 7 and in series to the resistor 18 of the boost converter 12. When no input voltage is present, the switch $T_2$ is closed by the input voltage monitor 17. Accordingly, the charge of the piezo element 7 can be discharged quickly via the resistor 18 and the closed switch $T_2$. When the piezo element 7 is discharged, the switch $T_2$ is opened by the input voltage monitor 17.

The output voltage monitor 16 and the input voltage monitor 17 are preferably combined in an IC component.

The evaluation circuit 8 comprises an oscillator 19 which generates alternating current. The alternating current is detected by current-voltage measuring unit 20 which is connected by a capacitor 21 to the piezo element 7. The piezo element 7 and the capacitor 21 provide a load for the oscillator 19.

When the piezo element 7 is excited, its impedance and thus also the voltage, respectively, current change. This is detected by the measuring unit 20 which sends corresponding signals to the evaluation and decision unit 22. The unit 22 compares the transmitted valued with a preset nominal value. It corresponds to a state in which the contact points 5, 6 (FIG. 1) of the switch 1 are not fused to one another. The two measuring units 20 and 22 are advantageously combined in an IC component of the evaluation circuit 8.

When the piezo element 7 is exited, it expands and deflects the contact spring 2 (FIG. 1) to such an extent until its contact point contacts the contact point 6 of the contact spring 3. During proper operation of the switch 1, the contact spring 2 will return when the piezo element is no longer actuated into the position represented in FIG. 1 in which the two contact points 5, 6 are spaced from one another. However, when the contact points 5, 6, due to fusing remain attached to one another, the piezo element 7 remains in the moved position because it is fixedly connected to the contact spring 2. This results in the measuring unit 20 receiving and measuring a voltage and current value which deviates from the nominal value. The measuring unit 20 thus supplies corresponding signals to the evaluation and decision unit 22 which compares these transmitted signals with a nominal value and, upon detection of deviations, sends a corresponding control signal to the monitoring unit 10. The monitoring unit 10 in conjunction with the control circuit 9 then ensures that the switch 1 can not be activated (triggered) again, as has been explained in connection with FIG. 1.

In addition to the aforedescribed contact fusion, any allowable or prohibited state, for example, breakage of the piezo element or breakage of the slide 26 (FIG. 5) can be compared and evaluated based on the combination of input and output values in monitoring unit 10.

Since the contact spring 2 of the switch is directly and rigidly connected to the energy converter 7, the deflection of the energy converter 7 is directly detected by the aforedescribed circuitry, for example, that of the piezo element in the embodiment according to FIG. 2. With the disclosed embodiment an electronic error detection is provided without requiring additional sensors. When a piezo element is used as the energy converter, energy can be regained by using the generating effect and the charge provided within the piezo element in the respective contracted phase of the piezo element and can be supplied to the system as a whole. Thus, the electromechanical efficiency of the system as a whole can be increased. The switch 1 in the form of a relay has, because of its disclosed construction, only a minimal constructive size and also only minimal masses that must be moved. Accordingly, such a relay has substantially shorter switching times than conventional relays which operate with a slide and indirect coupling to the armature of the relay. Especially, in the disclosed relay 1 an opener is no longer needed; such an opener in conventional relays is a necessity in order to monitor the proper operation of the relay. In the inventive relay 1 the number of required contact springs is thus lower. In the simplest case, as represented in FIG. 1, the relay has only one single closing element with the two contact springs 2, 3. Relays for safety application of a conventional design with force-guided contacts require in the simplest embodiment, in addition to such a closing element, an opener.

In addition to its use as a relay, the switch, for example, can also be used as a residual current operated device and residual voltage operated device, a power switch, or as a protective motor switch. By changing the electrical terminal behavior, as, for example, the converter resonance or attenuation during load, monitoring of the state of the energy converter 7 is possible. Especially, it is also possible to perform an evaluation during static operation. The disclosed device for this reason is especially suitable as a relay drive in safety-relevant devices.

Figure 3:
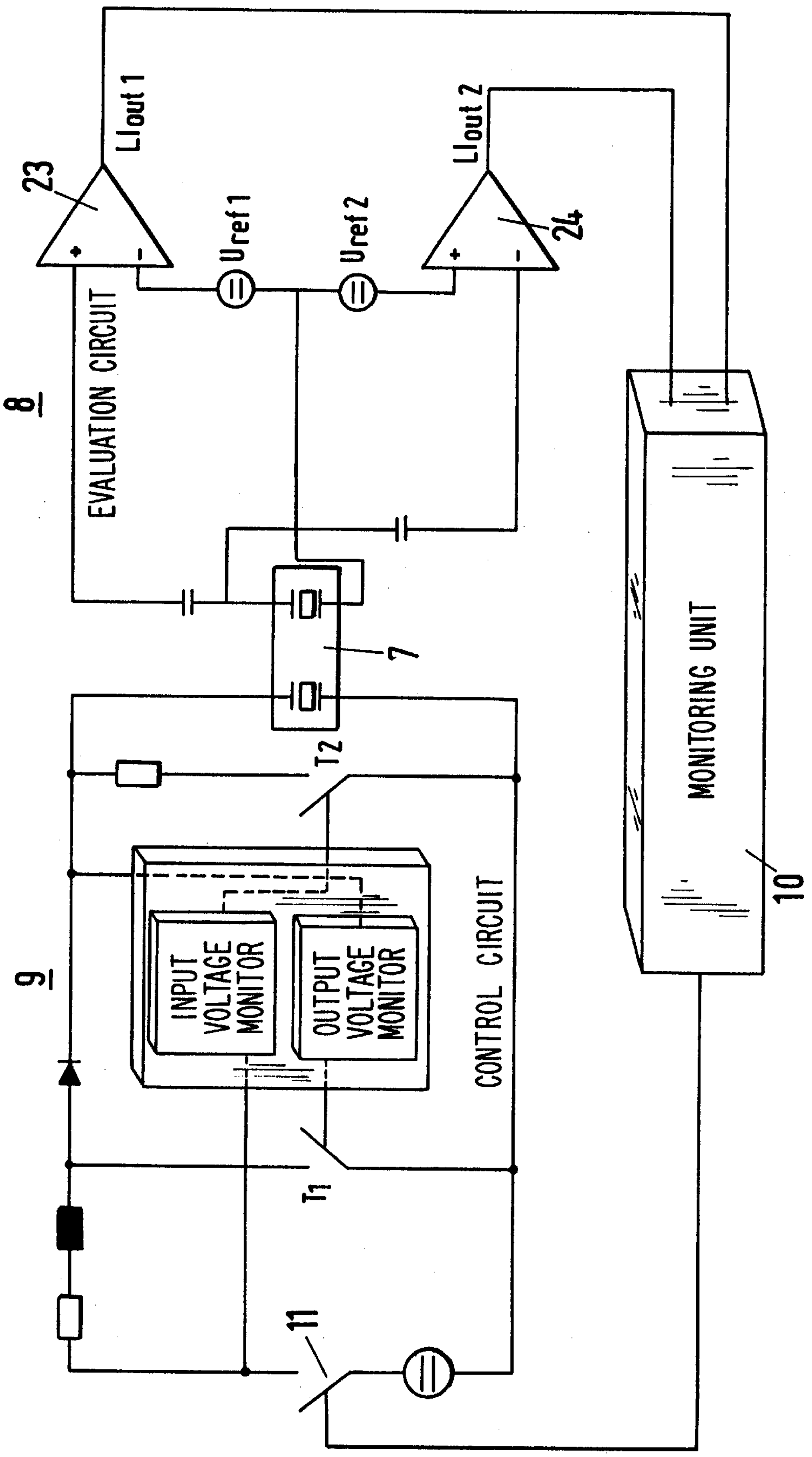
FIG. 3 shows a second embodiment of the drive member in a representation corresponding to FIG. 2.

In the embodiment according to FIG. 3 the energy converter 7 is embodied in the form of a piezoelectric bending element which can be in the form of a two, three or multi-layer converter. In the shown embodiment, two electrically separated layers are provided which are fixedly connected to one another. When the switch 11 is triggered, one layer of the bending converter 7 will contract whereby, because of the fixed connection to the second piezo layer, the second layer is also bent. Thus, in the second piezo layer a charge separation occurs, i.e., a voltage impulse will result which is detected and evaluated by the evaluating circuit 8. This evaluating circuit 8 comprises two comparators 23, 24 to which the bending converter 7 is respectively connected. Within the comparators 23, 24 the reference voltage $U_{ref1}$, respectively, $U_{ref2}$ is compared to the voltage impulses generated within the second piezo layer of the bending converter 7. The two comparators 23, 24 supply a corresponding output signal $U_{ref1}$ and $U_{ref2}$ that is supplied to the monitoring unit 10. The monitoring unit 10, as has been disclosed in detail in connection with FIGS. 1 and 2, will send corresponding signals to the control circuit 9 which is embodied identical to the aforedisclosed embodiments.

In principle, a two, three or multi-layer converter can also be employed and evaluated in the manner disclosed in connection with FIG. 2.

When the contact pieces 5, 6 (FIG. 1) of the switch 1 fuse together, this is detected with the aid of comparing the reference voltage with the voltage values provided by the bending converter 7 within the comparators 23, 24. Corresponding output signals will be supplied to the monitoring unit 10, which in the manner disclosed in connection with FIG. 1 and 2, will send corresponding signals to the control circuit 9. In this manner, a reliable error detection is also ensured whereby the control circuit 9 ensures that for fused contact pieces 5, 6 the switch 1 with the bending converter 7 cannot be triggered.

Figure 4:
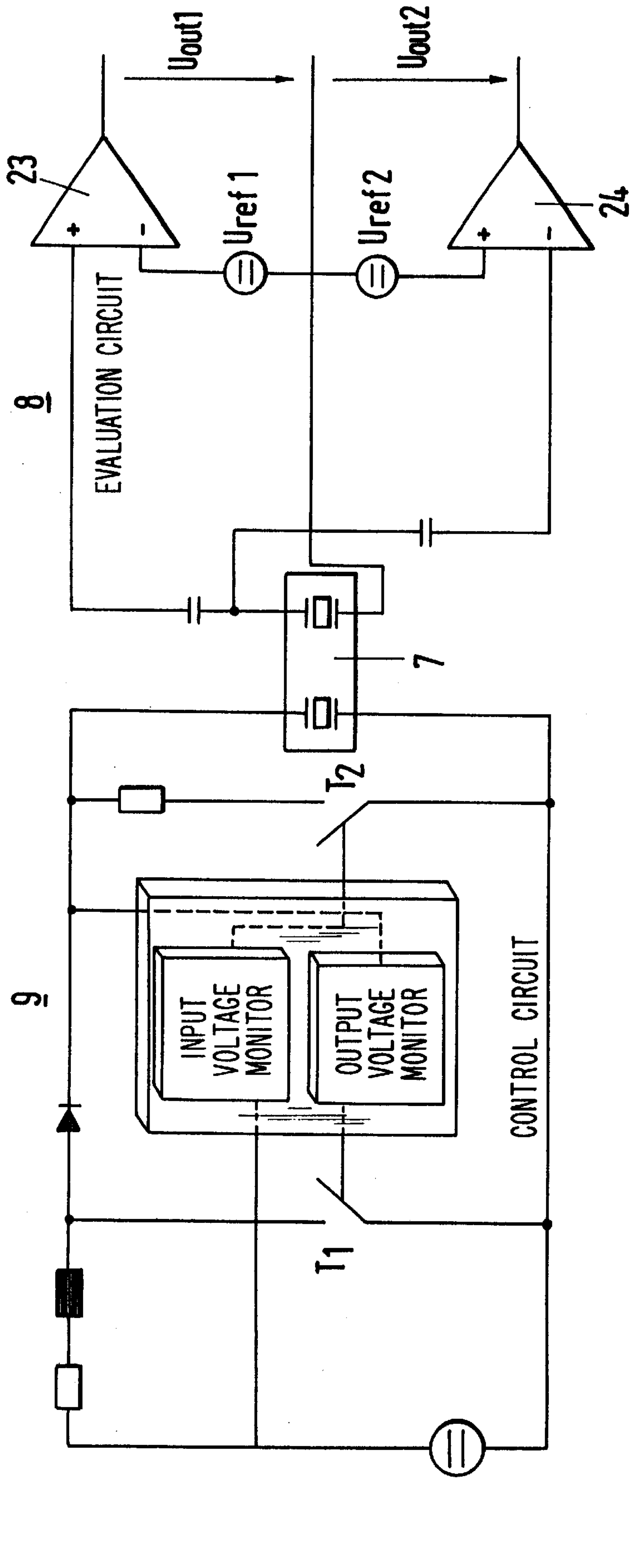
FIG. 4 shows a third embodiment of the drive member.

The embodiment according to FIG. 4 differs from the previously disclosed embodiments only in that a monitoring device 10 to which is connected the control circuit 9 is not provided. The voltage output signals $U_{out1}$ and $U_{out2}$ of the cooperators 23, 24 of the evaluation circuit 8 in this case are, for example, supplied to a display which, when the contact pieces 5, 6 are fused, will illuminate and thus visually indicate an error at the switch 1. In addition or instead of the visual indicator, it is, for example, also possible to use an acoustic signal. In other aspects the embodiment according to FIG. 4 operates identical to the embodiment of FIG. 3.

Figure 5:
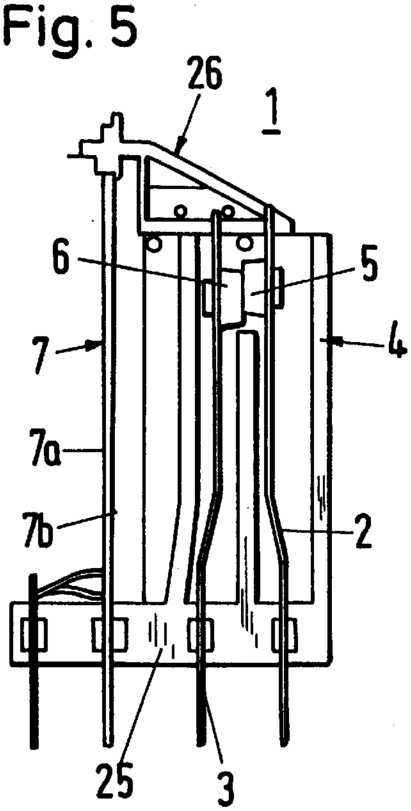
FIG. 5 shows the inventive switch embodied as a relay.

FIG. 5 shows in longitudinal section a switch 1 embodied as a relay. This switch 1 has a piezoelectric bending converter 7 with two piezo layers 7*a* and 7*b* which are electrically separated from one another. The bending converter 7 is fastened to the bottom 25 of the switch housing 4. At the upper end the bending converter 7 is fixedly connected to the slide 26 which is, in turn, fixedly connected to the contact spring 2. The slide 26, for example, can be placed onto the upper end of the bending converter 7 and can be secured by clamping. It is also possible to connect the slide 26 in a non-detachable manner to the bending converter 7, for example, by using an adhesive.

In the shown embodiment the two contact springs 2 and 3 provide an opener, i.e., the contact pieces 5 and 6 of the contact springs 2, 3 abut one another. The relay 1 is provided at the opposite side, below the plane of the drawing, with a corresponding closing element whose two contact springs have contact pieces which in the non-excited state of the relay are spaced apart. One of the contact springs of this closing element is also connected to the slide 26 and thus fixedly connected to the bending converter 7.

When the relay 1 is actuated, the bending converter 7 is bent to the right in the representation of FIG. 5. The slide 26 fixedly connected thereto is correspondingly moved to the right and entrains the contact spring 2. The respective contact spring of the non-represented closing element of the relay 1 is also entrained. The contact piece 5 of the contact spring 2 lifts thus the contact piece 6 of the contact spring 3 so that the opener opens the relay. Correspondingly, on the other side of the relay the contact pieces of the contact springs of the closing element are brought into contact.

In the shown embodiment the piezo layer 7*b* (to the right in the drawing FIG. 5) is connected to the evaluating circuit 8 (FIGS. 1 through 4) which evaluates the impedance change or the occurring voltage impulses of this piezo layer 7*a* in the aforedescribed manner. When the relay 1 is no longer actuated, i.e., the bending converter 7 is no longer supplied with current, it is returned into the initial position shown in FIG. 5. With the aid of the slide 26 it entrains the contact spring 2 until the contact piece abuts the contact piece of the contact spring 3. At the opposite side of the relay the two contact pieces of the contact springs are disengaged.

Advantageously, the contact spring 2 of the opener can be resiliently biased in the open direction (FIG. 5). Thus, it assists in bending the bending converter 7 into the non-represented actuated position. Upon closing the contacts 5, 6 of the non-represented closing element, the required contact pressure is determined to a minimal amount by the force of the bending converter 7, and primarily by the bias of the contact spring 2 so that the required contact pressure can be reliably achieved. The bias of the contact spring 2 is selected such that even for extended use of the relay and respective wear of the contact pieces 5, 6 a sufficient contact pressure is ensured.

In the same manner, the contact spring 2 of the non-represented closing element can be biased in the actuating direction in a manner similar to the aforedescribed one. For relays with multiple contacts, a combination of the bias of the contact springs can ensure a force situation that assists the movement of the piezoelectric converter and generates the required contact forces.

The piezo layer 7*b* which is advantageously strip-shaped, forms an activating piezo layer while the oppositely arranged piezo layer 7*a* is a sensory piezo layer. The bending converter 7 and the contact springs 2, 3 can be mounted easily within the relay housing 4. The slide 26 can also simply be fastened to the bending converter 7 and the corresponding contact springs of the opener and the closing element of the relay. A contact spring 3 for the opener, respectively, the closing element of the relay 1 is without connection to the slide 26. It is comprised of electrically non-conducting material, preferably plastic. In order to provide for a simple fastening to the contact springs, the slide 26 is provided with respective snap-on openings for the contact springs.

Figure 6:
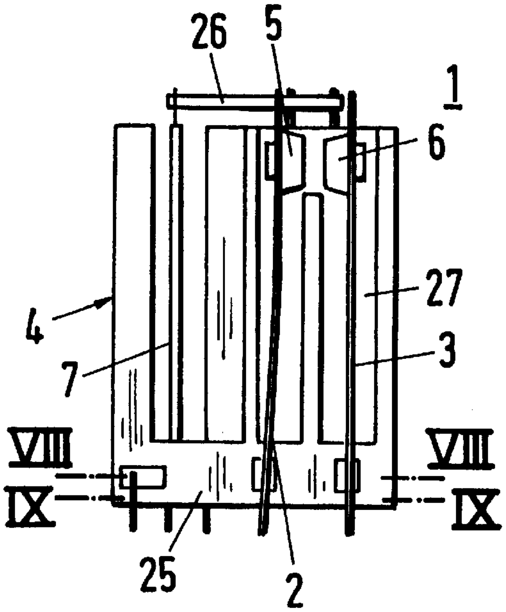
FIGS. 6 and 7 show the two sides of a further embodiment of an inventive switch embodied as a relay.
Figure 7:
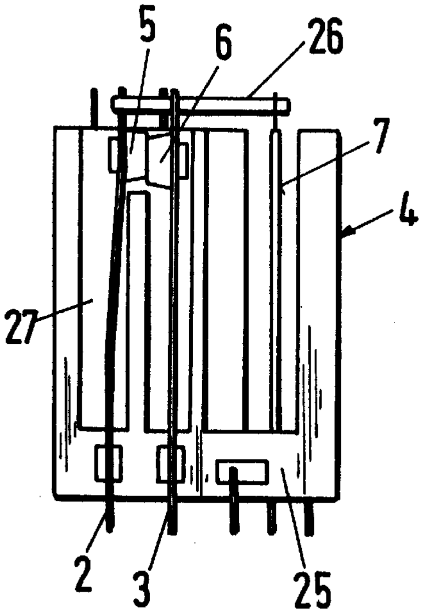
Figure 8:
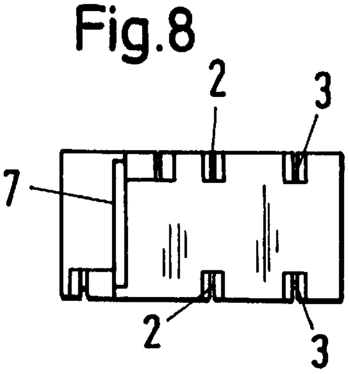
FIG. 8 shows a section along line VIII—VIII in FIG. 6.
Figure 9:
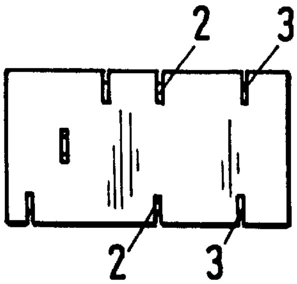
FIG. 9 shows a section along the line IX—IX in FIG. 6.

FIGS. 6 through 9 show a further switch 1 in the form of a relay. In FIGS. 6 and 7, the two sides of the relay are represented which include the contact springs 2, 3. The contact springs 2, 3 according to FIG. 6 form a closing element while the contact springs 2, 3 according to FIG. 7 provide an opener. The contact pieces 5, 6 of the contact springs 2, 3 (FIG. 6) forming the closing element have in the initial position a spacing therebetween. The contact pieces 5, 6 of the contact springs 2, 3 forming the opener are contacting one another in the initial position. The two sets of contacts are separated from one another by a wall 27 of the relay housing 4, respectively, its contact socket. The lower ends of the contact springs 2, 3 are fastened at the bottom 25 of the contact socket in a manner known per se. The contact springs 2, 3 project upwardly past the wall 27.

In the relay housing 4 the piezoelectric converter 7 is fastened. The bending converter 7 is represented in strip shape and is comprised of a single, double, triple or multi layer converter that is fastened with its lower end within the bottom 25. The upper end of the bending converter 7 projects past the wall 27. The slide 26, which is embodied plate-shaped in the shown embodiment, is fixedly connected to the upper end of the bending converter 7. Furthermore, the contact spring 2 of the closing element (FIG. 6) as well as the contact spring 3 of the opener (FIG. 7) are fastened to the slide 26. The two other contact springs of the closing element and of the opener are not connected to the slide 26 which is arranged at a small distance above the wall 27. Since the slide 26 is fixedly connected to the piezoelectric bending converter 7, the contact spring that is respectively connected to the slide can be resiliently biased.

When the bending converter 7 is deformed under a current load, the slide 26 in FIG. 6 moves to the right, respectively, to the left in FIG. 7. Thus, the contact pieces 5, 6 of the closing element (FIG. 6) contact one another, while the contact pieces 5, 6 of the opener (FIG. 7) are moved away from one another. Since the contact springs 2 of the closing element and of the opener are advantageously resiliently biased, the slide 26 is moved assisted by the spring bias and the respective contacts 5, 6 are closed or opened. Especially during closing of the contacts 5, 6 (FIG. 6), the required contact pressure is provided only to a small amount by the force of the bending converter 7, but is primarily provided by the bias of the contact spring 2.

Figure 10:
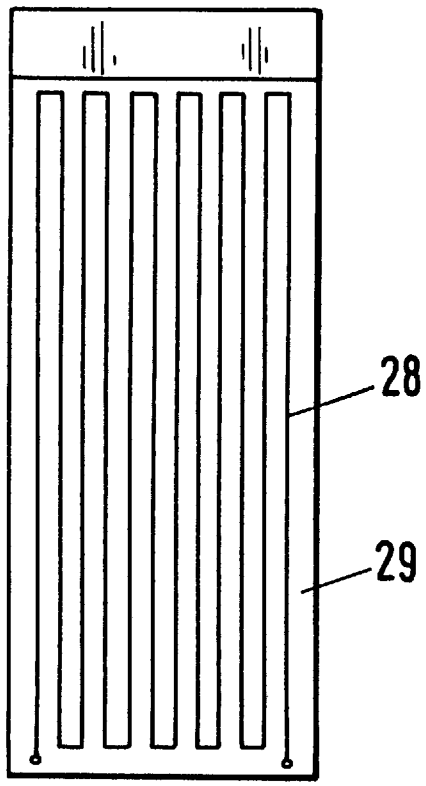
FIG. 10 is a resistance measuring element that can be applied to a piezoelectric ceramic layer.

It is also possible to provide a resistance measuring element 28 (FIG. 10) onto the piezoelectric ceramic layer that is not actively used with the aid of serigraphy in order to use it as a sensor. Due to the mechanical connection of the two piezo layers 7*a*, 7*b* the sensor layer 29 is then also bent. With the stretching of the resistant measuring path 28 which extends, for example, in the shape of a meander, the bending action can be detected similar to the function of a wire strain gauge.

The present invention is, of course, in no way restricted to the specific disclosure of the specification and drawings, but also encompasses any modifications within the scope of the appended claims.

What we claim is:

1. A switch comprising:

at least one pair of switching elements;

a drive member for moving one of said switching elements relative of said at least one pair relative to another one of said switching elements of said one pair for opening and closing said switch;

wherein said one switching element of said at least one pair is fixedly connected to said drive member and wherein said drive member is a solid-state energy converter;

at least one side connecting said drive member to said one switching elements of said at least one pair, wherein said at least one slide is fixedly connected to said drive member and to said one switching elements of said at least one pair, wherein said at least one slide acts on said one switching elements of said at least one pair in a direction transverse to a longitudinal direction of said one switching element of said at least one pair.

2. A switch comprising:

at least one pair of switching elements;

a drive member for moving one of said switching elements of said at least one pair relative to another one of said switching elements of said at least one pairs for opening and closing said switch;

wherein said one switching element of said at least one pair is fixedly connected to said drive member and wherein said drive member is a solid-state energy converter;

an evaluation circuit connected to said drive member for detecting and evaluating a characteristic parameter of said drive member, wherein said evaluation circuit based on evaluation of said characteristic parameter provides error detection for said switch.

3. A switch according to claim 2, further comprising at least one slide connecting said drive member to said one switching element of said at least one pair.

4. A switch according to claim 3, wherein said at least one slide is fixedly connected to said drive member and to said one switching element of said at least one pair.

5. A switch according to claim 2, wherein said evaluation circuit comprises an oscillator for generating alternating current.

6. A switch according to claim 5, further comprising a current and voltage measuring device for detecting said alternating current.

7. A switch according to claim 6, further comprising a comparator, arranged downstream of said current and voltage measuring device, for comparing measured actual values to a nominal value and sending a control signal, based on the comparison results of the measured actual values to the nominal value, to said monitoring unit.

8. A switch according to claim 1, wherein said switching elements are contact springs.

9. A switch according to claim 8, wherein said contact springs comprise at least one contact piece.

10. A switch according to claim 8, wherein said solid-state energy converter is a piezoelectric converter.

11. A switch according to claim 6, wherein said piezoelectric converter is a bending converter comprising at least one piezoelectric layer.

12. A switch according to claim 6, further comprising at least one booster spring assisting a bending movement of said energy converter.

13. A switch according to claim 8, wherein said booster spring is said contact spring.

14. A switch according to claim 1, wherein said solid-state energy converter is a magnetostrictive energy converter.

15. A switch according to claim 2, wherein said characteristic parameter is electric impedance or voltage.

16. A switch according to claim 2, wherein said characteristic parameter is an electrical resistance of an electrode surface of said energy converter.

17. A switch according to claim 2, further comprising a monitoring unit connected to said evaluation circuit, wherein said evaluation circuit sends a signal based on an evaluation of said characteristic parameter to said monitoring unit.

18. A switch according to claim 17, further comprising a control circuit connected to said monitoring unit, wherein said control circuit controls said drive member.

19. A switch according to claim 18, wherein said control circuit controls an input voltage and an output voltage of said drive member.

20. A switch according to claim 2, wherein said evaluation circuit comprises two comparators and wherein said drive member is connected to said two comparators.

21. A switch according to claim 20, wherein said comparators compares a reference voltage to a measured actual voltage at said drive member.

22. A switch according to claim 21, wherein said comparators supply a control voltage, based on the comparison results of the reference voltage and the measured actual voltage.

23. A switch according to claim 22, wherein said control voltage is supplied to said monitoring unit.

* * * * *